(12) United States Patent
Yoda et al.

(10) Patent No.: US 8,148,444 B2
(45) Date of Patent: Apr. 3, 2012

(54) SHEET FORMABLE MONOMER COMPOSITION, HEAT CONDUCTIVE SHEET AND PRODUCTION METHOD OF THE HEAT CONDUCTIVE SHEET

(75) Inventors: Masaki Yoda, Sagamihara (JP); Yoshinao Yamazaki, Yokohama (JP)

(73) Assignee: 3M Innovative Properties Company, Saint Paul, MN (US)

( * ) Notice: Subject to any disclaimer, the term of this patent is extended or adjusted under 35 U.S.C. 154(b) by 0 days.

(21) Appl. No.: 12/446,514

(22) PCT Filed: Oct. 19, 2007

(86) PCT No.: PCT/US2007/081935
§ 371 (c)(1),
(2), (4) Date: Apr. 21, 2009

(87) PCT Pub. No.: WO2008/055014
PCT Pub. Date: May 8, 2008

(65) Prior Publication Data
US 2010/0314573 A1  Dec. 16, 2010

(30) Foreign Application Priority Data

Oct. 31, 2006  (JP) ................. 2006-295376

(51) Int. Cl.
C08J 5/18 (2006.01)
C08J 3/28 (2006.01)
B29K 33/00 (2006.01)
C08F 2/48 (2006.01)

(52) U.S. Cl. ............ 522/75; 522/83; 522/120; 522/121; 522/42; 522/64; 522/137; 522/300; 524/81; 524/86; 524/401

(58) Field of Classification Search ............ 522/83, 522/64, 79, 75, 167, 175, 182, 120, 121, 522/42; 428/329, 409; 523/137, 300; 524/81, 524/86, 401

See application file for complete search history.

(56) References Cited

U.S. PATENT DOCUMENTS

| 6,207,272 | B1 | 3/2001 | Takahira et al. |
| 6,479,563 | B1 * | 11/2002 | Liebing et al. .................. 522/13 |
| 6,517,744 | B1 * | 2/2003 | Hara et al. ..................... 252/506 |
| 6,730,397 | B2 * | 5/2004 | Melancon et al. ......... 428/355 R |
| 6,803,392 | B1 * | 10/2004 | Kohler et al. .................... 522/64 |
| 7,079,405 | B2 * | 7/2006 | Tobita et al. .................. 363/21.1 |
| 7,713,628 | B2 * | 5/2010 | Botrie et al. ................ 428/411.1 |
| 2006/0249714 | A1 | 11/2006 | Hiroshige et al. |
| 2006/0263619 | A1 | 11/2006 | Izumi et al. |
| 2007/0179223 | A1 | 8/2007 | Hiroshige et al. |
| 2007/0231552 | A1 | 10/2007 | Yoda et al. |
| 2010/0304630 | A1 * | 12/2010 | Morikawa et al. .............. 442/59 |

FOREIGN PATENT DOCUMENTS

DE  103 46 327  4/2005

(Continued)

Primary Examiner — Susan W Berman (57) ABSTRACT

To provide a composition useful for forming a heat conductive sheet that satisfies both high heat conductivity and sufficient softness, has sufficient cohesive strength at a surface portion of a heat conductive sheet and does not cause remaining paste and breakage of an electronic appliance when the sheet is peeled. The composition comprises (A) a photo polymerizable component consisting of a (meth)acryl type monomer or its partial polymer; (B) a heat conductive filler; (C) a photo reaction initiator for initiating the polymerization of the photo polymerizable component; and (D) a photo absorber for absorbing and removing a predetermined wavelength band from electromagnetic rays used for the polymerization of the photo polymerizable component.

7 Claims, 2 Drawing Sheets

FOREIGN PATENT DOCUMENTS

| | | |
|---|---|---|
| DE | 10 2004 050 8 | 4/2006 |
| JP | 10-316953 | 12/1998 |
| JP | 2001-310984 | 11/2001 |
| JP | 2003-238760 | 8/2003 |
| JP | 2004-059851 | 2/2004 |
| JP | 2004-315663 | 11/2004 |
| JP | 2005-226007 | 8/2005 |
| JP | 2005-354002 | 12/2005 |
| WO | WO 2005/042612 A1 | 5/2005 |
| WO | WO 2005/044875 A1 | 5/2005 |

* cited by examiner

SHEET FORMABLE MONOMER COMPOSITION, HEAT CONDUCTIVE SHEET AND PRODUCTION METHOD OF THE HEAT CONDUCTIVE SHEET

TECHNICAL FIELD

This invention relates to a sheet formable monomer composition. More particularly, the present invention relates to a sheet formable monomer composition for forming a heat conductive sheet. The invention relates also to a production method of a heat conductive sheet that uses the monomer composition as a starting material and to the resulting heat conductive sheet. The heat conductive sheet according to the invention is useful as a heat radiation sheet and can be advantageously used when a heat sink, a heat radiation sheet, or the like, is bonded to an electronic appliance such as a semiconductor package.

BACKGROUND

A heat conductive sheet has widely been used to bond a heat sink (cooling member), a heat radiation sheet, or the like, to electronic appliances in order to efficiently cool or emit heat generated inside the electronic appliances as is well known in the art. With the reduction of the sizes of electronic appliances and the improvement in the integration density of these appliances in recent years, demands for heat conductive sheets that have a high heat transfer rate, are soft and flexible during use and apply only a small load to CPU chip, etc, have increased. At the same time, the requirement for a heat conductive sheet using a non-silicone type resin (inclusive of siloxane) that is free from the occurrence of a contact defect has become greater in view of the problem of the contact defect in electronic appliances caused by silicon-containing compounds.

The sheet conductive sheets using the non-silicone type resin are described in Japanese Unexamined Patent Publication (Kokai) No. 2001-310984 and Japanese Unexamined Patent Publication (Kokai) No. 2003-238760. JP 2001-310984, for example, describes a heat conductive molding of a heat conductive composition prepared by adding 100 to 700 parts by weight of a heat conductive filler such as aluminum oxide and 400 to 900 parts by weight of soft magnetic powder to 100 parts by weight of a base resin formed from a thermoplastic elastomer (block copolymer). JP 2003-238760 describes a non-halogen flame-retardant heat radiation sheet prepared by blending 100 to 150 parts by weight of a metal hydroxide type flame retardant, 1 to 10 parts by weight of red phosphorus and 500 to 700 parts by weight of a heat conductive filler to 100 parts by weight of a binder resin formed of an ethylene acrylate polymer and an ethylene-methyl acrylate type copolymer. According to the methods described in these Patent Documents, however, the viscosity of the heat conductive composition containing the polymer component and the filler becomes extremely high when large amounts of the heat conductive filler is packed to improve heat conductivity, and kneading and molding operations become difficult when a sheet is molded from the composition.

Attempts to highly pack the heat conductive filler are also described in Japanese Unexamined Patent Publication (Kokai) No. 2004-59851, Japanese Unexamined Patent Publication (Kokai) No. 10-316953 and Japanese Unexamined Patent Publication (Kokai) No. 2004-315663, for example. JP 2004-59851, for example, describes a flame retardant, heat conductive and electric insulating pressure sensitive adhesive composition containing an alkyl(meth)acrylate type monomer, a photo polymerization initiator, heat conductive and electric insulating filler particles and a polymer type dispersant, and an adhesive sheet formed by curing (photo polymerizing) this composition by the irradiation of ultraviolet rays or radioactive rays. JP 10-316953 describes a peelable heat conductive pressure sensitive adhesive containing 100 parts by weight of a copolymer between (meth)acrylic acid alkyl ester and an ethylene type monomer capable of copolymerizing with the former, 20 to 400 parts by weight of a plasticizer and 10 to 1,000 parts by weight of a heat conductive filler, and an adhesive sheet formed by coating or transferring the adhesive. JP 2004-315663 describes an acryl type heat conductive composition containing a binder component containing a crystalline acrylic polymer consisting of a polymer of (meth)acrylic acid ester monomers having alkyl groups of at least 18 carbon atoms and a heat conductive filler, and an acryl type heat conductive sheet obtained by processing this composition into a sheet form. A heat polymerization method or a UV polymerization method can be employed for the polymerization of precursors (monomers) of the binder component.

However, the methods described above are not free from the following problems. When the heat conductive sheet formed of the polymer is acquired by polymerizing and curing the monomers, for example, it is preferred to employ the UV polymerization method as the curing method among the heat polymerization method and the UV polymerization method described above from the aspects of energy saving and easiness of control of the sheet properties. When the UV polymerization method is used, however, the problem remains in that softness of the resulting heat conductive sheet is extremely low when the heat conductive filler is packed only in a higher density. Therefore, as described in JP 10-316953, a plasticizer must be added to the heat conductive composition. To more sufficiently secure softness, the mere addition of the plasticizer is not sufficient and it is preferred to change at least 98 wt % of the monomer component contained in the (meth)acrylic type monomer or its partial polymer contained in the heat conductive composition to an alkyl (meth)acrylate type monomer having a glass transition point of a homopolymer of below −40° C. However, the cohesive strength of the surface portion of the heat conductive sheet obtained in this case is extremely low. In consequence, remainder of paste and breakage of electronic appliances are likely to occur and the sheet is extremely difficult to peel when the heat conductive sheet is bonded to the electronic appliances and is again peeled after the heat radiation plate, etc, is fixed as often employed in this technical field. Because the re-bonding operation of the heat conductive sheet is frequently carried out, the low cohesive strength of the surface portion of the heat conductive sheet is an extremely critical problem. From the feature of the UV curing method, the molecular weight of the (meth)acrylic type polymer component of the surface portion of the sheet is likely to be lower than the molecular weight of the polymer component inside the sheet when the heat conductive sheet is observed in the direction of thickness. Further, the drop of the cohesive strength at the surface portion of the sheet is more remarkable than in the heat curing method.

SUMMARY

It is an object of certain embodiments of the present invention to provide a monomer composition for forming a heat conductive sheet that solves the problems of the prior art technologies described above, satisfies both high heat conductivity and sufficient softness and has sufficient cohesive strength at a surface portion of a heat conductive sheet.

It is another object of certain embodiments of the invention to provide a method of producing a heat conductive sheet by using such a monomer composition and the resulting heat conductive sheet.

The above and other objects of the invention in its various embodiments will be easily understood from the following detailed explanation.

The inventors of the present invention have conducted intensive studies for finding out a composition useful for forming a heat conductive sheet, have discovered as a result that blending of a photo absorbent capable of curing predetermined monomers by photo polymerization and absorbing a predetermined wavelength band of electromagnetic rays used for photo polymerization to the monomer composition is useful and have completed the present invention that will be hereinafter explained in detail.

According to one aspect of the present invention, there is provided a monomer composition for forming a heat conductive sheet, comprising:

(A) a photo polymerizable component consisting of a (meth)acryl type monomer or its partial polymer;

(B) a heat conductive filler;

(C) a photo reaction initiator for initiating the polymerization of the photo polymerizable component; and (D) a photo absorbent for absorbing and at least partially removing a predetermined wavelength band from electromagnetic rays used for the polymerization of the photo polymerizable component.

According to another aspect of the invention, there is provided a heat conductive sheet formed of a sheet formable monomer composition of the present invention.

According to still another aspect of the invention, there is provided a production method of a heat conductive sheet comprising the step of irradiating electromagnetic rays of a predetermined wavelength band to the monomer composition of the present invention.

DETAILED DESCRIPTION OF THE PREFERRED EMBODIMENTS

Various embodiments of the present invention can acquire various remarkable effects as will be understood from the following detailed explanation. For example, since the invention uses the non-silicone type resin, the invention is free from the possible occurrence of contact defect of electronic appliances. Energy can be save much more than in heat polymerization and control of sheet performances can be easily made. Furthermore, high heat conductivity and sufficient softness can be simultaneously satisfied and the surface portion of the heat conductive sheet can have sufficient cohesive strength. In the invention, the heat conductive sheet can be easily peeled at the time of re-bonding and residual contamination from the heat conductive sheet and the destruction of electronic appliances do not occur. The invention also does not involve complicated kneading and molding operations.

Embodiments of the invention include a monomer composition for forming a heat conductive sheet, a heat conductive sheet using the monomer composition and a method for producing the heat conductive sheet. Here, the term "heat conductive sheet" represents those products which have forms of sheet, film, etc, and are used widely for transferring and emitting heat generated in electronic appliances (semiconductor packages, semiconductor devices, etc) in electronic and other technologies, and the shape of the sheet and its size are not particularly limited. The heat conductive sheet is generally used for bonding a heat sink (cooling member), a heat radiation plate, and the like, to the electronic appliance in order to efficiently cool or emit heat generated in the electronic appliance.

Figure 1:
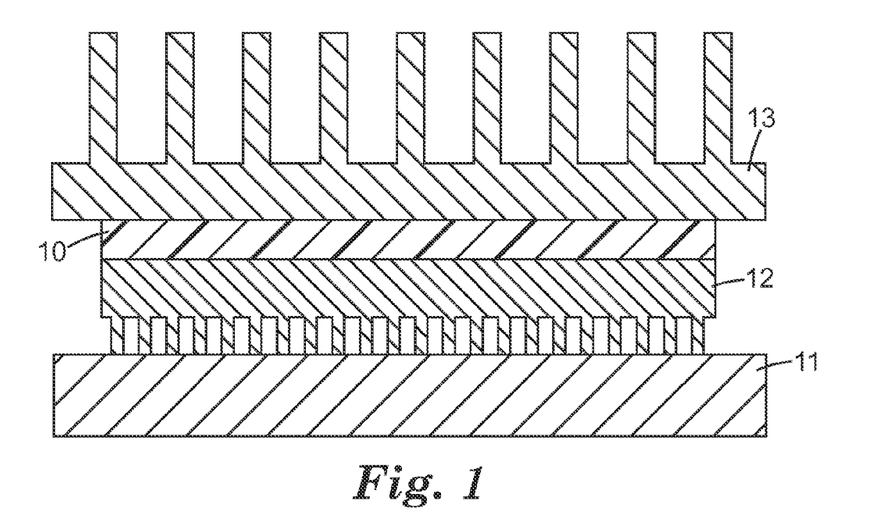
FIG. 1 is a sectional view showing a use example of a heat conductive sheet according to the invention.

FIG. 1 is a sectional view showing one use example of a heat conductive sheet according to the invention. In the drawing, a semiconductor package 12 is shown mounted onto a circuit substrate 1 such as a silicon substrate, for example. The semiconductor package 12 has built therein a semiconductor device such as an LSI chip and other electronic components, though they are not shown in the drawing. The semiconductor package is a mere example and a transformer or other components may be mounted in place of the semiconductor package. Needless to say, a plurality of devices and parts may be mounted in an arbitrary combination, whenever necessary. The semiconductor package 12 is likely to generate heat during use. To radiate the heat so generated, therefore, a heat radiation plate 13 equipped with a large number of fins as shown in the drawing is fitted through the heat conductive sheet 12 of the invention. Incidentally, a heat sink may be used though the heat radiation plate 13 is shown fitted in the drawing.

As explained, the heat conductive sheet according to the invention can achieve a large number of remarkable functions and effects and can be therefore utilized extremely advantageously when the heat radiation means and the cooling means described above are fitted to the electronic appliance.

The description will be given once again. The heat conductive sheet according to the invention can achieve high heat conductivity. For example, the invention can achieve heat conductivity of about 2 W or more. Heat conductivity can be enhanced generally by packing large amounts of heat conductive filler. According to the prior art technology, however, the greater the packing amount of the filler, the higher becomes the viscosity of a coating solution with the result of the drop of productivity but the present invention can avoid such a problem. As a result of the increase of the filler amount, the resulting sheet is likely to have lower flexibility according to the prior art technology but the present invention can avoid such a problem, too. In consequence, the handling property can be improved. Particularly because flexibility is improved, the heat conductive sheet according to the invention can be safely handled by a ball grid array (BGA) technology which is not resistant to pressure and in which handling must be made with care. This feature can be expressed by an initial compressive stress, too. The present invention can accomplish a compressive stress of 50 N/cm$^2$ or below at a compression ratio of 50%.

In practice, the heat conductive sheet according to the invention can accomplish excellent softness. Therefore, when the heat conductive sheet is sandwiched between a heat generation component and a heat radiation component or a cooling component, the sheet of the invention can arbitrarily undergo deformation in accordance with the form of each component and can exhibit excellent form response. In other words, the sheet of the invention does not apply a load to the component.

Here, softness of the heat conductive sheet is preferably expressed by "Asker C" hardness. Measurement of the Asker C hardness is conducted by stacking the sample heat conductive sheets (thickness: 1 mm) to form a 10 mm-thick sample. This sample is put to an Asker C hardness meter and a value measured at a load of 1 kg is called "hardness (Asker C)". Here, the scale value after 10 seconds from the contact of the hardness meter with the sample is employed as the measurement value. The Asker C hardness is 100 at maximum and is 5 at minimum from the aspect of the handling property. The Asker C hardness is preferably 5 to 25 and further preferably about 8 to about 18.

The heat conductive sheet according to the invention is also excellent in flame resistance and can satisfy the standard required for electronic components. In other words, according to the invention, the flame resistance class V-0 in UL Flame Resistance Test Standard UL-94 (Underwriters Laboratories, Inc. Standard No. 94) "Flame Resistance Test of Plastic Materials for Electronic Appliances Components" (1966) can be passed relatively easily. The softer the sample and the smaller its thickness, the more difficult becomes the accomplishment of V-0 because this test is a combustion test that is carried out while the sample is kept in a vertical position. It is noteworthy that no such problem occurs in the present invention. For example, V-0 can be accomplished even when the thickness of the sample is about 1 to about 2 mm.

Further, the heat conductive sheet according to the invention is excellent in the working factor. In other words, the sheet is stiff, its surface layer portion has strength and the sheet does not undergo deformation during handling without the remainder of the paste.

The heat conductive sheet according to the invention has its feature in that it does not contain the silicone resin that has widely been used in this technical field, and can achieve low contamination property. In other words, because a gas of low molecular weight siloxane does not occur from the silicone resin, the contact defect of the electronic appliance resulting from the gas can be avoided.

The heat conductive sheet according to the invention can exhibit excellent cohesive strength. In customary sheets, the aggregation property of the sheet is likely to be a counterbalance to its softness but the sheet according to the invention can satisfy both softness of the sheet and its aggregation property. In consequence, the remainder of the paste does not occur even when the sheet is peeled at the time of re-work, for example.

In addition to the characteristic advantage described above, the heat conductive sheet according to the invention has high producibility and the kneading operation, the molding operation, etc, can be easily carried out within a short time during its production process with high production yield of the sheet. Particularly because the invention uses the reactive monomer as the starting material in place of the polymers of the prior art, the desired heat conductive sheet can be acquired by merely blending the heat conductive filler to the monomer to prepare a sheet formable monomer composition and then irradiating the electromagnetic rays to the composition to cause the photo-polymerization. Because the invention uses the reactive monomer, the invention can increase the packing amount of the filler and can regulate the viscosity of the composition to a low level.

Furthermore, because the invention employs curing of the sheet by the photo-polymerization, the invention can carry out the production process at an in-situ temperature including normal temperature (substantially room temperature), such as about −10 to 50° C., and can also accomplish the improvement of economy of the production installation, easiness of design, easiness of quality control, and so forth. Incidentally, the photo-polymerization process can be carried out within substantially the same time as the heat polymerization process of the prior art.

The heat conductive sheet according to the invention can be formed by an arbitrary photo polymerization method from a sheet formable monomer composition comprising the following components:

(A) a photo polymerizable component consisting of a (meth)acryl type monomer or its partial polymer;

(B) a heat conductive filler;

(C) a photo reaction initiator for initiating the polymerization of the photo polymerizable component; and (D) a photo absorbent for absorbing and at least partially removing a predetermined wavelength band from electromagnetic rays used for the polymerization of the photo polymerizable component.

The sheet formable monomer composition may comprise additional components, whenever necessary. Each of the components will be hereinafter explained.

(A) Photo Polymerizable Component

The photo polymerizable component can be called a "binder component" because it plays the role of a binder in the monomer composition according to the invention. The photo polymerizable component consists of a (meth)acryl type monomer or its partial polymer and its detail is not particularly limited. Especially, (meth)acryl type monomers having an alkyl group of 20 or less carbon atoms are suitably used. Suitable examples of the (meth)acryl type monomers include ethyl(meth)acrylate, butyl(meth)acrylate, hexyl(meth)acrylate, 2-ethylhexyl(meth)acrylate, octyl(meth)acrylate, isooctyl(meth)acrylate, decyl(meth)acrylate, dodecyl(meth)acrylate and others.

Further, to increase a cohesive strength of the resulting heat conductive composition, it is also preferred that the above photo polymerizable component is used in combination with a (meth)acryl type monomer wherein a homopolymer (single polymer) thereof has a glass transition temperature (Tg) of not less than 20° C. and/or polyfunctional (meth)acrylate. Examples of (meth)acryl type monomer, a homopolymer of which has a Tg of not less than 20° C., include acrylic acid and anhydride thereof, methacrylic acid and anhydride thereof, itaconic acid and anhydride thereof, maleic acid and anhydride thereof, and other carboxylic acids and the corresponding anhydrides thereof. Other examples of (meth)acryl type monomer, a homopolymer of which has a Tg of not less than 20° C., include cyanoalkyl(meth)acrylate, acrylamide, substituted acrylamide such as N,N-dimethyl acrylamide, nitrogen-containing compounds such as N-vinylpyrrolidone, N-vinylcaprolactam, N-vinylpiperidine and acrylonitrile. Still other examples of such a monomer include tricyclo decyl(meth)acrylate, isobolonyl(meth)acrylate, hydroxy (meth)acrylate, vinyl chloride and others. Examples of polyfunctional (meth)acrylate include trimethylolpropane (meth) acrylate, pentaerythritol tetra(meth)acrylate, 1,2-ethyleneglycol di(meth)acrylate, 1,6-hexanediol di(meth) acrylate and others.

From the aspect of softness of the resulting heat conductive sheet, it is preferred in the invention that at least 98 wt %, on the basis of the total amount of the photo polymerizable components, consists of an alkyl(meth)acryl type monomer whose homopolymer has glass transition point of below −40° C. Typical examples of a suitable alkyl(meth)acryl include n-butyl acrylate, 2-ethylhexyl acrylate and isooctyl acrylate, though they are in no way restrictive.

The photo polymerizable component may have a partial polymer of the (meth)acryl type monomer, whenever necessary. The partial polymer of the (meth)acryl type monomer is effective for preventing the filler from setting in the resulting monomer composition when the heat conductive filler is mixed with the photo polymerizable component. In other words, the setting of the filler owing to the thickening effect can be prevented by polymerizing in advance a part of the (meth)acryl type monomer. The addition amount of the partial polymer of the (meth)acryl type monomer is preferably from about 5 to about 20 wt % on the basis of the sum of the monomer composition. As a result, the viscosity of the monomer composition can be adjusted to about 100 to about 10,000 centi-poises (cP). Partial polymerization of the (meth)acryl type monomer can be executed by an arbitrary method such as heat polymerization, UV polymerization and electron beam polymerization.

The (meth)acryl type monomer or its partial polymer described above that is used as the photo polymerizable component may be used either alone or in an arbitrary combination of two or more kinds In the invention, such a photo polymerizable component(s) can be used in a various amount (s). In the case of aluminum hydroxide filler, the use amount of the photo polymerizable component is generally about 5 to about 30 wt % (based on the total amount of the monomer composition), and preferably the use amount of the photo polymerizable composition is from about 8 to about 25 wt %. When the use amount of the photo polymerizable component is smaller than 5 wt %, softness drops, and according to the cases, an cohesive strength may be further lowered. When the use amount exceeds 30 wt %, on the contrary, the heat transfer rate becomes insufficient.

(B) Heat Conductive Filler

The sheet formable monomer composition according to the invention uses the heat conductive filler for accomplishing a high level of heat conductivity in the resulting heat conductive sheet. This heat conductive filler can be added in a higher concentration than the heat conductive filler of the prior art and can improve the aggregation force of the monomer composition in spite of the addition in the high concentration.

It is possible to use, for example, ceramics, metal oxides, metal hydroxides and metals as the heat conductive filler. Preferably, these fillers are used while dispersed uniformly in the monomer composition. Generally, the fillers are used in the forms of powder and particles such as polygonal, elliptic, spherical, needle-like, flat sheet-like, flake-like shapes, and the like (hereinafter generically called "particles"). The particle diameter of the filler particles can be changed in a broad range but is generally about 500 μm or below, preferably about 1 to about 30 μm and further preferably about 1 to about 15 μm. The strength of the resulting sheet undesirably drops when the particle diameter of the filler is too great or too small. The particle diameters of the fillers may be substantially equal or otherwise, relatively large particles and relatively small particles may be combined with one another with a good balance. When the fillers having different sizes are used, the small particles are arranged between the large particles and improve packing efficiency. Silane treatment, titanate treatment, polymer treatment, etc, may be applied to the surface of the filler particle. These surface treatments can impart strength, water resistance and insulating property to the sheet.

In the practice of present invention, a metal hydroxide is preferably used as the heat conductive filler from the aspects of the packing density, economy and flame resistance. Suitable examples of such metal hydroxides include aluminum hydroxide and magnesium hydroxide though they are in no way restrictive. Of these metal hydroxides, aluminum hydroxide is particularly useful. Heat conductive filler such as alumina may further be added, whenever necessary.

The heat conductive filler described above can be used in various amounts in the film formable monomer composition. Particularly, the content of the heat conductive filler is preferably from about 400 to about 1,000 parts by mass on the basis of 100 parts by mass of the photo polymerizable component (A), that is, the (meth)acryl type monomer or its partial polymer, in order to acquire sufficient heat conductivity and heat resistance. Further preferably, in the case of aluminum hydroxide, the content of the heat conductive filler is from about 400 to about 1,000 parts by mass on the basis of 100 parts by mass of the photo polymerizable component (A). When the content of the filler is smaller than 400 parts by mass, flame resistance and electric conductivity become insufficient and when it exceeds 1,000 parts by mass, on the contrary, the viscosity of the resulting heat conductive monomer composition becomes so high that molding becomes difficult. Incidentally, such a content of the heat conductive filler means at least about 60 wt %, preferably at least about 70 wt %, when expressed on the basis of the total amount of the monomer composition.

The use of the heat conductive filler is essential in the present invention. In addition, fillers having other properties may be additionally used, whenever necessary. In other words, the present invention uses the photo absorbent (D) for absorbing and removing a predetermined wavelength band from the electromagnetic rays used for the polymerization of the photo polymerizable component (A) but an electromagnetic wave absorbing filler may be used in supplementation as long as the same function as that of the photo absorbent can be obtained. Soft ferrite compounds, soft magnetic metals, carbon powder, etc, for example, can be used as the electromagnetic wave absorbing filler.

(C) Photo Reaction Initiator

To initiate the polymerization of the photo polymerizable component, the sheet formable monomer composition according to the invention uses a photo reaction initiator. Arbitrary photo reaction initiators can be used in various amounts in accordance with the polymerization properties of the photo polymerizable component (A), that is, the (meth) acryl type monomer or its partial polymer.

In the practice of the invention, the present invention preferably uses the ultraviolet rays as the exposure electromagnetic rays for the photo polymerization and a compound suitable for the UV rays is preferably used as the photo reaction initiator. Particularly because the invention executes the polymerization of the photo polymerizable component and uses the UV rays after the removal of a predetermined wavelength band from the UV rays, it is advantageous to use a phosphine oxide type compound exhibiting absorption in a wavelength rang of about 400 to about 450 nm as the photo reaction initiator. Typical examples of such phosphone oxide type compounds are bis(2,4,6-trimethylbenzyl)phenylphosphine oxide and 2,4,6-trimethylbenzyldisphenylphosphine oxide though they are not particularly restrictive. These photo reaction initiators may be used either alone or in an arbitrary combination of two or more kinds As described above, the photo reaction initiator can be used in various amounts in the film formable monomer composition. The content amount of the photo reaction initiator is preferably about 0.05 to 1.0 part by mass on the basis of 100 parts by mass of the photo polymerizable component (A), that is, the (meth)acryl type monomer or its partial polymer, and further preferably about 0.1 to about 0.6 parts by mass on the basis of 100 parts by mass of the photo polymerizable component (A). When the amount of the photo reaction initiator is smaller than 0.05 parts by mass, the reaction conversion ratio drops and the acrylic odor of the sheet becomes strong. When the amount exceeds 1.0 part by mass, on the contrary, the aggregation force of the sheet drops and the working factor gets deteriorated.

(D) Photo Absorbent

The sheet formable monomer composition according to the invention uses a photo absorbent to absorb and remove a predetermined wavelength band from the electromagnetic rays used for polymerizing the photo polymerizable components. Here, the necessity for absorbing and removing a predetermined wavelength band from the electromagnetic rays will be explained about the ultraviolet rays that can be advantageously used as the electromagnetic rays in the invention with reference to FIGS. 3 and 4, by way of example.

Figure 3:
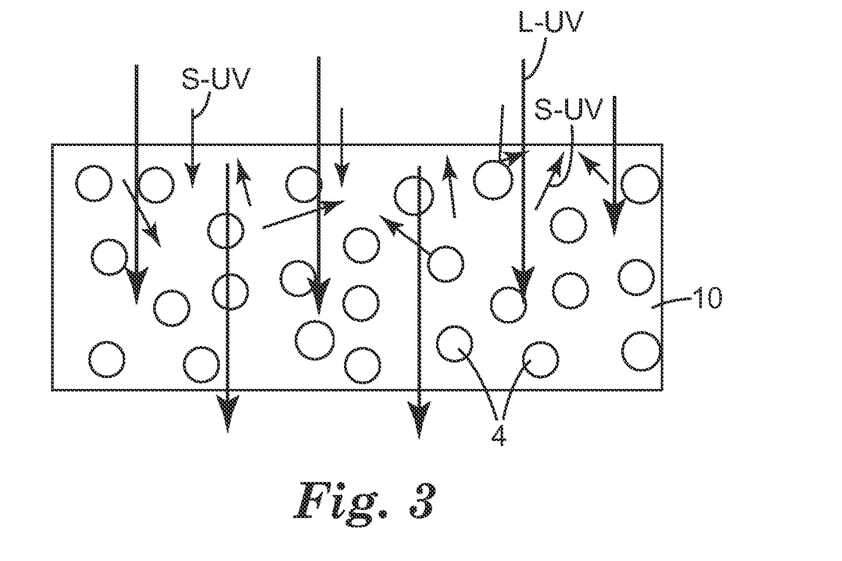
FIG. 3 is a sectional view typically showing behavior of ultraviolet rays during UV curing of a heat conductive sheet.

FIG. 3 schematically shows the state where the heat conductive filler 4 is dispersed substantially uniformly in the heat conductive sheet 10 according to the invention without precipitation as is observed in the prior art technology. Incidentally, the ultraviolet rays are used hereby for polymerizing the photo polymerizable components and the heat conductive sheet 10 is under the state where curing proceeds owing to photo polymerization with the irradiation of the ultraviolet rays, that is, the state of the heat conductive sheet 10 that is not yet cured or is during curing (the sheet formable monomer composition shaped into the sheet form).

Generally when the ultraviolet rays are irradiated to the heat conductive sheet 10 that is not yet cured or is during curing, the ultraviolet rays having a relatively short wavelength (S-UV) and ultraviolet rays having a relatively long wavelength (L-UV) are simultaneously irradiated to the sheet 10 as shown in the drawing. The inventors have acquired the following observation. The ultraviolet rays having short wavelength (S-UV) are likely to scatter and exhibit a remarkable scattering phenomenon in the proximity of the surface of the sheet 10, and many reaction starting points develop in the proximity of the surface. As a result, the portion near the surface has a low molecular weight and its cohesive strength drops. On the other hand, the ultraviolet rays of long wavelength are difficult to scatter and can travel straight as such from the surface into the inside without being affected by the filler 4 existing on the way as shown in the drawing.

Under such circumstances, it is necessary to take the recent technology in the field of electronic appliances into account. In other words, when a heat radiation plate or the like is fitted to an electronic appliance through the heat conductive sheet, initial compressive stress of the heat radiation plate at the time of its fitting becomes problem assuming that the electronic appliance is a BGA chip, for example. Generally, the heat conductive sheet is used while being pushed to the electronic appliance. Even if the heat conductive sheet is handled carefully, an excessive load is applied and the heat conductive sheet is likely to undergo deformation or its electrical performance is likely to drop. To avoid such problems, the initial compressive stress of the heat conductive sheet is preferably 50 N/cm$^2$ or below. In practice, however, the desired initial compressive stress cannot be achieved owing to the influences of the ultraviolet rays described above. It is therefore the problem for the inventors of the present invention to develop the heat conductive sheet capable of reducing the initial compressive stress at 50% compression to 50 N/cm$^2$ or below while keeping as such the heat conductivity and the cost. The inventors of the present invention have examined to eliminate the problem of the drop of the cohesive strength at the surface of the heat conductive sheet without much affecting the compressive stress. As a result of studies, the inventors have assumed that the cohesive strength in the proximity of the surface of the sheet would be improved by removing the ultraviolet rays of the short wavelength (S-UV) from the ultraviolet rays.

Figure 4:
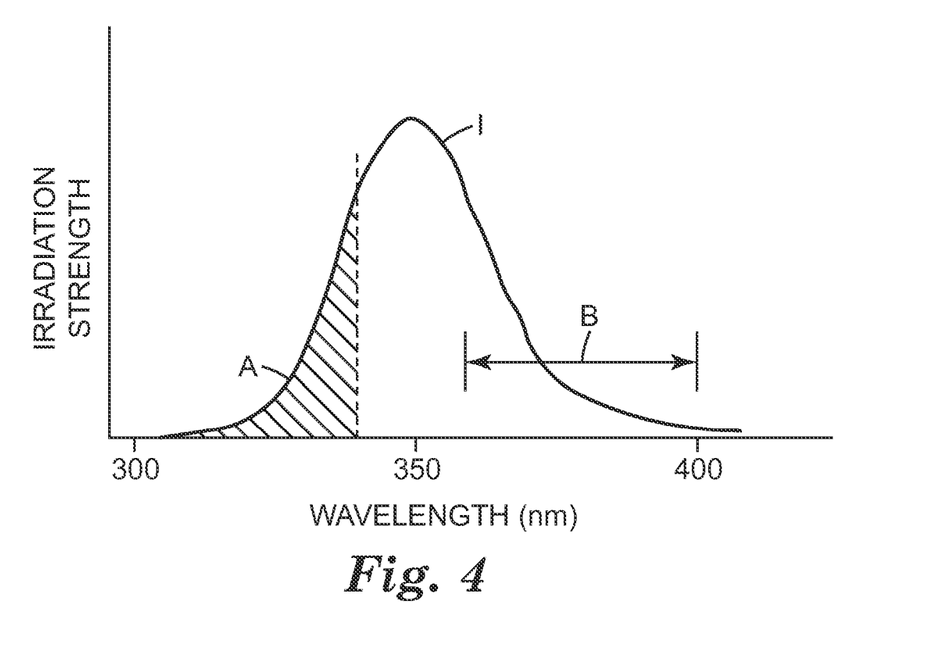
FIG. 4 is a spectral diagram showing light emission spectra of the ultraviolet rays.

Referring to FIG. 4, the wavelength of the ultraviolet rays is generally within the range of about 180 to about 460 nm and the ultraviolet rays I shown in the drawing has a wavelength range of near 300 nm to near 400 nm. In the drawing, a region A below the wavelength 350 nm is the "predetermined wavelength band" referred to in the present invention, particularly the ultraviolet ray region (S-UV) of the short wavelength. On the other hand, a region B above the wavelength 350 nm is the ultraviolet ray region (L-UV) of the long wavelength. It is the concept of the present invention to remove or decrease the ultraviolet ray region of the short wavelength (S-UV) from the ultraviolet rays while the ultraviolet ray region of the long wavelength (L-UV) is left. As technology for removing the ultraviolet ray region of the short wavelength (S-UV) from the ultraviolet rays, the invention can advantageously use the photo absorbent explained hereby. If necessary, the ultraviolet ray itself may be modified for the suitable execution of the invention in place of the use of the photo absorbent. For example, it is possible to use specific ultraviolet rays having a suitable wavelength as the ultraviolet rays used for polymerizing the photo polymerizable components or to pass the ultraviolet rays before irradiation through a filter or spectral means to selectively remove only unnecessary ultraviolet rays or ultraviolet rays having a wavelength band which may exert adverse influences.

Various photo absorbents can be used in the sheet formable monomer composition to absorb and remove the predetermined wavelength band from the electromagnetic rays. The kind of the photo absorbent and its use amount can be arbitrarily changed in accordance with the kinds and properties of the photo polymerizable components. As can be understood from the explanation given above, the ultraviolet rays can be advantageously used as the electromagnetic rays in the practice of the invention, and the ultraviolet region of the short wavelength (S-UV) is selectively removed from the ultraviolet rays. The ultraviolet ray region of the short wavelength is generally a ultraviolet ray band of a wavelength shorter than about 345 nm. Therefore, the invention can advantageously use a compound (UV absorbent) capable of removing a band of a wavelength shorter than about 345 nm from the ultraviolet rays.

Various compounds can be used as the UV absorbent capable of removing the wavelength band shorter than about 345 nm from the ultraviolet rays. Examples of the UV absorbents include triazine type compounds, and so forth, though they are not restrictive. Among them, the triazine type compounds can be advantageously used.

Typical examples of the triazine type compounds are "TINUVIN" Series UV absorbents (trade names) of Chiba Specialty Chemicals Co., such as TINUVIN400 and TINUVIN405.

The photo absorbent can be used in various amounts in the film formable monomer composition. The amount of the photo absorbent is generally and preferably about 0.5 to about 6 parts by mass on the basis of 100 parts by mass of the photo polymerizable component (A), that is, the (meth)acryl type monomer or its partial polymer. More preferably, the amount of the photo absorbent is about 1 to about 5 parts by mass on the basis of 100 parts by mass of the photo polymerizable component (A). When the amount of the photo absorbent is smaller than 0.5 parts by mass, the cohesive strength of the sheet drops and the working factor gets deteriorated. When the amount exceeds 5 parts by mass, on the contrary, the reaction conversion ratio drops and odor of the acrylic resin of the sheet becomes strong. Incidentally, the photo absorbent may be used either alone or in an arbitrary combination of two or more kinds.

(E) Plasticizer

The film formable monomer composition according to the present invention can contain a plasticizer generally used in the field of film formation in addition to the photo polymerizable component (A), the heat conductive filler (B), the photo reaction initiator (C) and the photo absorbent (D). The plasticizer is directed to impart softness and preferably has a boiling point of 150° C. or above from the aspect of the heat resistance. When a plasticizer having a boiling point below 150° C. is used, evaporation of the plasticizer takes place during the use of the heat conductive sheet for an extended period of time and the plasticizer is likely to contaminate electronic components, and the like. Suitable examples of the plasticizer include diisononyl adipate, diisodecyl adipate and tetraethylene glycol-di-ethylhexonate though these compounds are not restrictive. The plasticizer may be used either alone or in an arbitrary combination of two or more kinds The plasticizer can be used in various amounts in the film formable monomer composition. The amount of the plasticizer is generally and preferably about 40 to about 200 parts by mass on the basis of 100 parts by mass of the photo polymerizable component (A), that is, the (meth)acryl type monomer or its partial polymer. More preferably, the amount of the plasticizer is about 40 to about 120 parts by mass on the basis of 100 parts by mass of the photo polymerizable component (A). When the amount of the plasticizer is smaller than 40 parts by mass, softness cannot be imparted sufficiently to the sheet. When the amount exceeds 200 parts by mass, on the contrary, the cohesive strength remarkably drops and the working factor gets deteriorated.

(F) Other Components

The sheet formable monomer composition according to the invention can use arbitrary additives used in the field of the heat conductive sheet, whenever necessary. Examples of suitable additives include an antioxidant, a metal inactivator, a flame retardant, a tackifier, a precipitation inhibitor, a thixotropic agent, a surfactant, a de-foaming agent, a colorant, an antistatic agent, and so forth.

According to the invention, the heat conductive sheet of the invention can be produced by using the sheet formable monomer composition described above as a starting material through its photo polymerization.

The heat conductive sheet can be produced by using various methods within the scope of the invention. Generally, the components described above are collectively added to a mixer or are added while the addition sequence is arbitrarily deviated, and the resulting mixture is carefully kneaded to prepare the intended sheet formable monomer composition. To knead the mixture, kneading machine that is commercially available such as a planetary mixer can be used. After kneading, the sheet is formed from the resulting monomer composition. Calendar molding and press molding can be used for molding the sheet. These molding methods can be carried out by using customary means. According to calendar molding, for example, the sheet formable monomer composition is applied to a predetermined thickness to a support that has peelability to the monomer composition or is subjected to peel treatment, such as a liner, to form a non-cured film of the monomer composition. A polyethylene terephthalate (PET) film or other plastic films can be advantageously used as the support but a metal foil may be used, too. Because the electromagnetic rays for the photo polymerization are irradiated in the subsequent step, however, it is advantageous to use the support having permeability to the electromagnetic rays, that is, transparency to the electromagnetic rays. Die coating and roller coating can be used as the coating means. The thickness of the monomer composition can be arbitrarily changed depending on the thickness of the intended heat conductive sheet.

After the film of the monomer composition is formed, it is cured by the photo polymerization and the heat conductive sheet is formed. UV polymerization is preferably employed for the photo polymerization but other electromagnetic rays may be used depending on the kind of the photo polymerizable components. Examples of the usable electromagnetic rays are alpha rays, gamma rays and neutron rays. In short, it is important whether or not the electromagnetic rays used can induce the polymerization of the photo polymerizable components during polymerization as intended by the present invention. Various rays can be used as the UV source. Generally, mercury arc, low-, medium- and high-pressure mercury lamps, mercury lamps and metal halide lamps can be advantageously used from the aspects of easy availability and cost. The irradiation intensity and the irradiation time of the electromagnetic rays can be arbitrarily changed depending on various factors such as the kind of the photo polymerizable components and the thickness of the film. In the case of the UV rays, for example, the irradiation intensity is generally within the range of about 0.1 to about 10 mW/cm$^2$ and preferably within the range of about 0.3 to about 10 mW/cm$^2$. The irradiation time is generally about 5 to about 30 minutes. The photo polymerization process is generally carried out at a temperature of 20 to 50° C.

The intended heat conductive sheet can be obtained as a result of photo polymerization. The thickness of the heat conductive sheet can be changed in a broad range but is preferably used at a thickness as small as possible from the aspects of producibility, handling property and use for electronic appliances. The thickness of the heat conductive sheet is generally at least 0.1 mm and at most 10.0 mm. The thickness is preferably within the range of about 0.5 to about 5.0 mm and further preferably within the range of about 1.0 to about 2.5 mm.

Figure 2:
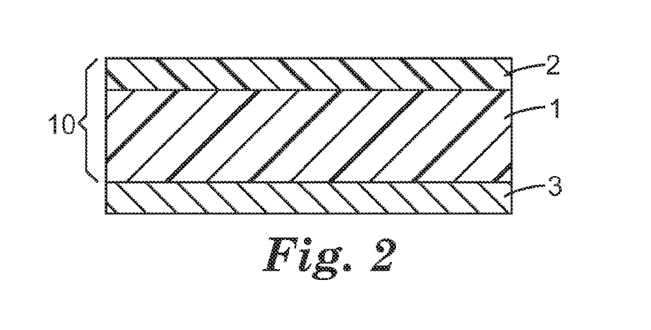
FIG. 2 is a sectional view showing an example of a heat conductive sheet according to the invention.

The heat conductive sheet is generally used in the form of a single layer but can be used in the form of a multi-layered film of two or more layers. FIG. 2 shows a heat conductive sheet 10 with a first heat conductive sheet layer 1 of low hardness (heat conductive sheet of the invention) and a second conductive sheet layer 2 of high hardness. The heat conductive sheet 10 is supported by a PET liner 3. The thickness of the first heat conductive sheet can be changed variously but is generally within the range of about 1.0 to 2.0 mm. The thickness of the second heat conductive sheet layer is generally smaller than that of the first heat conductive sheet layer and is within the range of about 0.1 to about 0.2 mm. The second heat conductive sheet layer may be a heat conductive sheet of the prior art and its detail is not limited, in particular. Such a heat conductive composite sheet can be prepared by using a customary lamination technology. As a result of the lamination of the second heat conductive sheet layer having higher hardness on the first heat conductive sheet layer, the handling property of the heat conductive sheet can be improved and deformation can be prevented. Note that the illustrated example shows that at least one heat conductive sheet is one according to the present invention, but it is also possible that both the first and second sheets are those according to the present invention.

Owing to its excellent properties, the heat conductive sheet according to the invention can be advantageously used in various technical fields including among others the electronic field. The heat conductive sheet can be advantageously used when a heat sink or a heat radiation plate is preferably fitted to an electronic appliance such as a semiconductor package, a power transistor, a semiconductor chip (IC chip, LSI chip, VLSI chip, etc), a central processing unit (CPU), and so forth. Needless to say, the forms and the sizes of the heat sink and the heat radiation plate used hereby are not limited, in particular.

EXAMPLES

Subsequently, the present invention will be explained with reference to its Examples. Incidentally, the invention is not limited to these Examples.

The invention used the following starting components to prepare a sheet formable monomer composition.
Photo Polymerizable Components:
  EHA (2-ethylhexyl acrylate)
  Acrylic acid
Cross Linking Agent:
  1,6-hexanediol diacrylate
Plasticizer:
  Tetraethylene glycol di-2-ethylhexonate
Photo Reaction Initiator:
  "Irgacure 819", trade name, Chiba Specialty Chemicals, Co.
  "Irgacure 651", trade name, Chiba Specialty Chemicals, Co.
Coupling Agent:
  "Titacoat S-151", trade name of titanate coupling agent, product of Nippon Soda K. K.
UV Absorbent:
  "TINUVIN 400", trade name, Chiba Specialty Chemicals, Co.
Heat Conductive Filler:
  aluminum hydroxide (mean particle size: 4 μm)

Example 1

As tabulated in Table 1 below, 100 parts by weight of the photo reactive component EHA (2-ethylhexyl acrylate), 0.1 parts by weight of the cross linking agent 1,6-hexanediol diacrylate, 60 parts by weight of the plasticizer tetraethylene glycol di-2-ethylhexanate, 0.4 parts by weight of the photo reaction initiator "Irgacure 819", 4 parts by weight of the coupling agent "Titacoat S-151", 4 parts by weight of the UV absorbent "TINUVIN 400" and 600 parts by weight of the heat conductive filler, i.e. aluminum hydroxide, were prepared as the starting components. These starting components were collectively fed into a planetary mixer and were kneaded for 30 minutes at a reduced pressure of 50 mmHg.

The resulting heat conductive composition was sandwiched between two transparent polyethylene terephthalate (PET) liners (about 50 μm-thick layer) each treated with a silicone treating agent and was calendar molded into a sheet form. While the sheet of the heat conductive composition was held inside the two PET liners, ultraviolet rays having irradiation intensity of 0.3 mW/cm² were irradiated to both surfaces of the sheet for 6 minutes and ultraviolet rays having irradiation intensity of 7.0 mW/cm² were subsequently irradiated to both surfaces of the sheet for 10 minutes. The sheet of the heat conductive composition was cured by photo polymerization and an acryl type heat conductive sheet having a thickness of 1 mm was obtained.

Comparative Examples 1 to 5

The procedure of Example 1 described above was repeated but in these Comparative Examples, the starting components were changed as tabulated in Table 1 below. A 1 mm-thick acryl type heat conductive sheet was obtained in each Comparative Example.

TABLE 1

| starting component | Composition (parts by weight) | | | | | |
|---|---|---|---|---|---|---|
| | Ex. 1 | Comp. Ex. 1 | Comp. Ex. 2 | Comp. Ex. 3 | Comp. Ex. 4 | Comp. Ex. 5 |
| EHA | 100 | 100 | 100 | 100 | 97 | 100 |
| acrylic acid | — | — | — | — | 3 | — |
| cross-linking agent | 0.1 | 0.1 | 0.3 | 0.12 | 0.1 | 0.28 |
| plasticizer | 60 | 60 | 60 | 30 | 60 | 60 |
| Irgacure 819 | 0.4 | 0.4 | 0.4 | — | 0.4 | 0.4 |
| Irgacure 651 | — | — | — | 0.2 | — | — |
| Titacoat S-151 | 4 | 4 | 4 | 1.5 | 4 | 4 |
| TINUVIN 400 | 4 | — | — | — | — | — |
| heat conductive filler | 660 | 660 | 660 | 450 | 660 | 400 |

Test Example 1

For the acryl type heat conductive sheets produced in Example 1 and Comparative Examples 1 to 5, (1) heat transfer rate, (2) sheet hardness and (3) cohesive strength of the sheet surface were evaluated by the following means, and the evaluation results tabulated in Table 2 were obtained.

Measurement of Heat Transfer Rate (Heat Conductivity)

A square cut piece of 0.01 m in length and 0.01 m in width (measurement area: $1.0 \times 10^{-4}$ m²) was cut out from each acryl type heat conductive sheet (thickness: L (m)) and was used as a measurement sample. Each sample produced was sandwiched between a heat generating plate and a cooling plate and power of 4.8 W was applied and the sample was held for 5 minutes. At this time, the temperature difference between the heat generation plate and the cooling plate was measured and heat resistance $R_L$ was determined by the following formula.

$$R_L(K \cdot m^2/W) = \text{temperature difference (K)} \times \text{measurement area (m}^2\text{)/power (W)}$$

Furthermore, a sample having a thickness of 2 L (m) was produced by laminating two cut chips described above and heat resistance $R_{2L}$ (K·m²/W) was measured in the same way as described above. Next, the heat conduction factor λ(W/m·K) was calculated by the following formula.

$$\lambda(W/m \cdot K) = L(m)/[R_{2L}(K \cdot m^2/W) - R_L(K \cdot m^2/W)]$$

Measurement of Sheet Hardness

Ten acryl type heat conductive sheets of each kind were laminated to form a measurement sample and its hardness was measured at a 1 kg load by using an Asker C hardness meter (produced by Kobunshi Keiki K. K.). In this instance, the scale value 10 second after the contact of the hardness meter with the sample was used as the measurement value. Incidentally, the smaller the value of the Asker C hardness, the higher the softness was.

Measurement of Cohesive Strength of Sheet Surface

The PET liner of one of the surfaces of one of the two acryl type heat conductive sheets of each kind was peeled and one-side tape #851A (produced by Sumitomo 3M Co.) was bonded to the peel surface. Furthermore, a 200 g roller was allowed to reciprocate on the surface for press bonding. One minute later from press bonding of the one-side tape, the tape was peeled by pinching one of the ends of the tape by fingers in a 180° direction at a speed of about 300 mm/min. Whether or not any adhering matters existed was observed with eye. The smaller the amount of the adhering matters, the higher the cohesive strength. In this example, the tapes in which the area ratio of the adhering matters to the tape surface of less than 2% were evaluated as "good", those having area ratios of 2% to less than 10% were evaluated as "fair" and those having area ratios exceeding 10%, as "not good".

TABLE 2

| characteristics | Ex. 1 | Comp. Ex. 1 | Comp. Ex. 2 | Comp. Ex. 3 | Comp. Ex. 4 | Comp. Ex. 5 |
|---|---|---|---|---|---|---|
| heat transfer rate (W/m · k) | 2.5 | 2.5 | 2.4 | 1.8 | 2.3 | 1.2 |
| hardness (Asker C) | 14 | 13 | 28 | 29 | 38 | 17 |
| cohesive strength | good | not good | fair | good | good | good |

It could be understood from the evaluation results tabulated in Table 2 that excellent results could be obtained in all aspects of the heat transfer rate, the sheet hardness and the cohesive strength of the sheet surface by using the starting components in combination as in Example 1 (example of this invention).

Comparative Examples 6 and 7 and Examples 2 to 4

The procedure of Example 1 was repeated. However, to examine the influences of the addition amount of the heat conductive filler on the heat transfer rate, the amount of the heat conductive filler was changed in such a fashion that the heat conductive filler (aluminum hydroxide) content was 50, 57, 62, 65 and 70 vol % on the basis of the total amount of the heat conductive composition. The content of the heat conductive filler was calculated at the specific weight of aluminum hydroxide of 2.4 g/cm$^3$ and the specific weight of the matrix portion of 1.0 g/cm$^3$. The measurement result tabulated in Table 3 could be obtained when the heat transfer rate of each heat conductive sheet was measured by the method described above. Further, with regard to the samples having a thickness of 1 mm, the flame resistance was measured according to the method of UL Flame Resistance Test Standard UL-94 to obtain the following results.

TABLE 3

|  | Comp. Ex. 6 | Comp. Ex. 7 | Ex. 2 | Ex. 3 | Ex. 4 |
|---|---|---|---|---|---|
| filler amount (vol. %) | 50 | 57 | 62 | 65 | 70 |
| heat transfer rate (W/m · k) | 1.2 | 1.8 | 2.5 | 3.5 | 7 |
| flame resistance (1 mm thickness) | V-2 | V-0 | V-0 | V-0 | V-0 |

It could be understood from the measurement result tabulated in Table 3 that the amount of aluminum hydroxide used as the heat conductive filler was preferably at least 50 vol % from the aspect of flame resistance. Examples 2 to 4 (examples of this invention) satisfied this requirement and could guarantee preferred heat conduction factors exceeding 2.0 (W/m·K).

Example 5

The procedure of Example 1 was repeated but in this example, the amount of each of the plasticizer, the UV absorbent and the cross linking agent was changed as tabulated in Table 4 to examine the influences of their amounts on the sheet hardness and the cohesive strength of the sheet surface when the amount of the heat conductive filler remained the same. To have the evaluation result more easily understood, the amount of the plasticizer was 60 or 80 parts by weight, the amount of the UV absorbent was 1, 3 or 6 parts by weight and the amount of the cross linking agent was 0.1, 0.2 or 0.3. The measurement results tabulated in Tables 4 to 6 were obtained.

TABLE 4

| Case No. | Plasticizer | UV Absorbent | Cross-linking Agent | Asker C Hardness | Cohesive Strength (remaining paste) | Remarks |
|---|---|---|---|---|---|---|
| 1 | 40 | 1 | 0.1 | 45 | good |  |
| 2 | 40 | 3 | 0.1 | 47 | good |  |
| 3 | 40 | 6 | 0.1 | 47 | good | * |
| 4 | 40 | 1 | 0.2 | 55 | good |  |
| 5 | 40 | 3 | 0.2 | 56 | good |  |
| 6 | 40 | 6 | 0.2 | 55 | good | * |
| 7 | 40 | 1 | 0.3 | 60 | good |  |
| 8 | 40 | 3 | 0.3 | 60 | good |  |
| 9 | 40 | 6 | 0.3 | 60 | good | * |

* low conversion ratio and strong acryl odor

TABLE 5

| Case No. | Plasticizer | UV Absorbent | Cross-linking Agent | Asker C Hardness | Cohesive Strength (remaining paste) | Remarks |
|---|---|---|---|---|---|---|
| 10 | 60 | 1 | 0.1 | 14 | fair |  |
| 11 | 60 | 3 | 0.1 | 15 | good |  |
| 12 | 60 | 6 | 0.1 | 13 | good | * |
| 13 | 60 | 1 | 0.2 | 25 | fair |  |
| 14 | 60 | 3 | 0.2 | 26 | good |  |
| 15 | 60 | 6 | 0.2 | 26 | good | * |
| 16 | 60 | 1 | 0.3 | 38 | good |  |
| 17 | 60 | 3 | 0.3 | 40 | good |  |
| 18 | 60 | 6 | 0.3 | 40 | good | * |

* low conversion ratio and strong acryl odor

TABLE 6

| Case No. | Plasticizer | UV Absorbent | Cross-linking Agent | Asker C Hardness | Cohesive Strength (remaining paste) | Remarks |
|---|---|---|---|---|---|---|
| 19 | 80 | 1 | 0.1 | 5 | not good |  |
| 20 | 80 | 3 | 0.1 | 6 | not good |  |
| 21 | 80 | 6 | 0.1 | 6 | not good | * |
| 22 | 80 | 1 | 0.2 | 14 | fair |  |
| 23 | 80 | 3 | 0.2 | 15 | good |  |
| 24 | 80 | 6 | 0.2 | 15 | good | * |
| 25 | 80 | 1 | 0.3 | 22 | fair |  |
| 26 | 80 | 3 | 0.3 | 24 | good |  |
| 27 | 80 | 6 | 0.3 | 25 | good | * |

* low conversion ratio and strong acryl odor

It could be understood from the measurement results tabulated in Tables 4 to 6 that Cases 11 and 23 were particularly preferred and Cases 14 and 24 were preferred, too.

The invention claimed is:

1. A sheet formable monomer composition for forming a heat conductive sheet, comprising:
    (A) a photo polymerizable component consisting of a (meth)acrylate-functional monomer or a mixture of the (meth)acrylate-functional monomer and partially polymerized (meth)acrylate-functional monomer;
    (B) a heat conductive filler;

(C) a photo reaction initiator for initiating the polymerization of said photo polymerizable component; and (D) a photo absorbent for absorbing and at least partially removing a wavelength band shorter than about 345 nm from ultraviolet rays used for the polymerization of said photo polymerizable component, wherein said photo absorbent (D) is contained in a proportion of about 1 to about 5 parts by mass on the basis of 100 parts by mass of said photo polymerizable component (A).

2. A monomer composition of claim 1, wherein said (meth) acrylate-functional monomer in said photo polymerizable component (A) has a glass transition point of −40° C. or below, when the monomer is in the form of its homopolymer.

3. A monomer composition of claim 1, wherein said heat conductive filler (B) is contained in a proportion of 400 to 1,000 parts by mass on the basis of 100 parts by mass of said photo polymerizable component (A).

4. A heat conductive sheet formed of a sheet formable monomer composition of claim 1.

5. A heat conductive sheet of claim 4, in which said sheet is formed at an in-situ temperature from about −10 to 50 ° C. by irradiating electromagnetic rays having a predetermined wavelength band to said monomer composition.

6. A heat conductive sheet of claim 4, in which said sheet has a multi-layered construction.

7. A production method of a heat conductive sheet comprising irradiating electromagnetic rays of a predetermined wavelength band to a monomer composition of claim 1 at an in-situ temperature from about −10 to 50 ° C.

\* \* \* \* \*